(12) United States Patent
Hu et al.

(10) Patent No.: US 9,084,345 B2
(45) Date of Patent: Jul. 14, 2015

(54) BACKLIGHT MODULE, PRINTED CIRCUIT BOARD USED FOR BACKLIGHT MODULE, AND MANUFACTURING METHOD FOR THE SAME

(71) Applicant: Shenzhen China Star Optoelectronics Technology Co., Ltd., Shenzhen, Guangdong (CN)

(72) Inventors: Che-chang Hu, Shenzhen (CN); Kuang-Yao Chang, Shenzhen (CN); Qian Cao, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 271 days.

(21) Appl. No.: 13/811,279

(22) PCT Filed: Jan. 11, 2013

(86) PCT No.: PCT/CN2013/070390
§ 371 (c)(1),
(2) Date: Jan. 20, 2013

(87) PCT Pub. No.: WO2014/107891
PCT Pub. Date: Jul. 17, 2014

(65) Prior Publication Data
US 2014/0192514 A1 Jul. 10, 2014

(51) Int. Cl.
*H05K 1/02* (2006.01)
*G02F 1/1335* (2006.01)
*H05K 1/05* (2006.01)

(52) U.S. Cl.
CPC ............ *H05K 1/0203* (2013.01); *G02F 1/1336* (2013.01); *H05K 1/056* (2013.01); *G02F 2001/133612* (2013.01); *G02F 2001/133628* (2013.01); *H05K 2201/0761* (2013.01); *H05K 2201/10106* (2013.01); *H05K 2203/0228* (2013.01); *H05K 2203/302* (2013.01)

(58) Field of Classification Search
CPC ................ H05K 1/0203; H05K 1/056; H05K 2201/10106; H05K 2203/302; G02F 1/1336; G02F 2001/133612
USPC ........................ 362/97.1, 97.2, 97.3, 294, 373
See application file for complete search history.

(56) References Cited

U.S. PATENT DOCUMENTS 6,517,218 B2 * 2/2003 Hochstein ..................... 362/294

\* cited by examiner

*Primary Examiner* — John A Ward
(74) *Attorney, Agent, or Firm* — Andrew C. Cheng

(57) ABSTRACT

The present invention discloses a backlight module, a printed circuit board used for a backlight module, and a manufacturing method for the same. The printed circuit board comprises a light bar region and a heat dissipating region. The light bar region used for mounting a light bar of the backlight module and formed with a conductive circuit for supplying power for the light bar; and the heat dissipating region connected with the light bar region, wherein, a connection location of the light bar region and the heat dissipating region disposes with a cutting slot and the cutting slot locates at a side of the printed circuit board for mounting the light bar in order to prevent a short-circuit connection between the heat dissipating region and the conductive circuit of the light bar region through the cutting slot. The present invention can avoid the short circuit problem due to uncompleted etching of the conductive layer on the heat dissipating region of the printed circuit board.

4 Claims, 2 Drawing Sheets

BACKLIGHT MODULE, PRINTED CIRCUIT BOARD USED FOR BACKLIGHT MODULE, AND MANUFACTURING METHOD FOR THE SAME

BACKGROUND OF THE INVENTION

1. Field of the Invention

The present invention relates to the field of liquid crystal display technology, and specifically relates to a backlight module, a printed circuit board used for a backlight module, and a manufacturing method for the same.

2. Description of Related Art

At present, the side-light type liquid crystal display has become the mainstream of the market. In the production of side-light type liquid crystal display, in order to guarantee the aesthetic appearance of the liquid crystal display, it usually requires to reduce the thickness of the frame of the liquid crystal display. Therefore, many side-light type liquid crystal display use bent type metal-based printed circuit board. By this way, the liquid crystal display does not require the aluminum extrusion in order to greatly reduce the thickness of the frame of the liquid crystal display. The pre-production of the bent type metal-based printed circuit board in the prior art comprising the steps of: 1), manufacturing a printed circuit board; 2), copper plating and etching on the printed circuit board, to remove the copper plating (i.e., conductive layer) on the heat dissipating region; 3) spraying insulating paint on the light bar region on the copper layer to form an insulating layer.

However, in the existing technology, it is possible to cause uncompleted etching of the copper plating layer of the heat dissipating region of the metal-based printed circuit board, while the remaining copper on the heat dissipating region easily cause a short circuit of the LED light bar.

SUMMARY OF THE INVENTION

The technical problem solved by the present invention is to provide a backlight module, a printed circuit board used for a backlight module, and a manufacturing method for the same to avoid the short circuit problem due to uncompleted etching of the copper plating layer on the heat dissipating region of the printed circuit board.

In order to solve the above-mentioned technical problem, a technical solution provided by the present invention is: a backlight module, wherein, the backlight module comprises a light bar and a printed circuit board, and the printed circuit board comprising: a light bar region used for mounting the light bar of the backlight module, being formed with a conductive circuit for supplying power for the light bar, comprising an aluminum (Al) layer of the light bar region, a dielectric layer of the light bar region, a conductive layer and an insulating layer, wherein the Al layer of the light bar region, the dielectric layer of the light bar region, the conductive layer and the insulating layer overlap sequentially; and a heat dissipating region connected with the light bar region, comprising an Al layer of the heat dissipating region and a dielectric layer of the heat dissipating region wherein the Al layer of the heat dissipating region and the dielectric layer of the heat dissipating region overlap sequentially; wherein, a connection location of the light bar region and the heat dissipating region disposes with a cutting slot and the cutting slot locates at a side of the printed circuit board for mounting the light bar in order to prevent a short-circuit connection between the heat dissipating region and the conductive circuit of the light bar region through the cutting slot.

Wherein, the cutting slot is a V-shaped slot.

Wherein, the printed circuit board is a metal-based printed circuit board.

Wherein, the light bar is a side-light type LED lamp.

In order to solve the above-mentioned technical problem, another technical solution provided by the present invention is: a printed circuit board for a backlight module, wherein, the printed circuit board comprising: a light bar region used for mounting a light bar of the backlight module, being formed with a conductive circuit for supplying power tier the light bar; and a heat dissipating region connected with the light bar region, wherein, a connection location of the light bar region and the heat dissipating region disposes with a cutting slot and the cutting slot locates at a side of the printed circuit board for mounting the light bar in order to prevent a short-circuit connection between the heat dissipating region and the conductive circuit of the light bar region through the cutting slot.

Wherein, the cutting slot is a V-shaped slot.

Wherein, the printed circuit board is a metal-based printed circuit board.

In order to solve the above-mentioned technical problem, another technical solution provided by the present invention is: a manufacturing method for a printed circuit board of a backlight module, wherein, manufacturing method comprises:

etching and patterning a conductive layer on a light bar region used for mounting the light bar and disposed on the printed circuit board to form a conductive circuit for supplying power to the light bar, and etching and cleaning a conductive layer on a heat dissipating region used for heat dissipation and disposed on the printed circuit board; cutting a connection location between the light bar region and the heat dissipating region to form a cutting slot, wherein the cutting slot is located at a side of the printed circuit board for mounting the light bar in order to prevent a short-circuit connection between the heat dissipating region and the conductive circuit of the fight bar region through the cutting slot.

Wherein, the printed circuit board is a metal-based printed circuit board and the step of cutting a connection location between the light bar region and the heat dissipating region to form a cutting slot comprising: proceeding a V-shaped cutting to form a V-shaped slot at the connection location between the light bar region and the heat dissipating region.

The present invention disposed with the cutting slot at the connection location of the light bar region and the heat dissipating region of the printed circuit board. Therefore, it effectively preventing the short-circuit connection between the heat dissipating region and the conductive circuit of the light bar region through the slot to completely cut off the connection between the heat dissipating region and the conductive layer of the light bar region of the printed circuit board. The present invention can avoid the short circuit problem due to uncompleted etching of the conductive layer on the heat dissipating region of the printed circuit board.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the skilled persons of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail.

Figure 1:
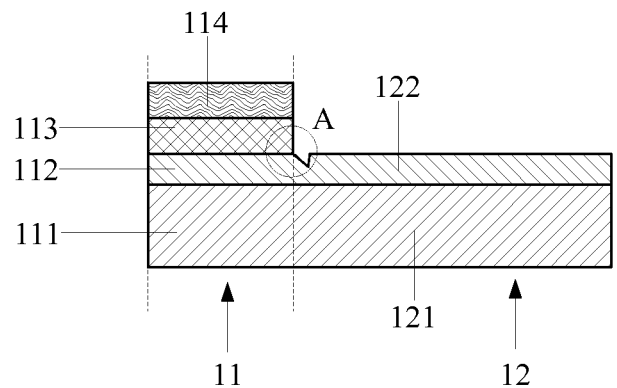
FIG. 1 is a schematic diagram of a printed circuit board according to an embodiment of the present invention.
Figure 2:
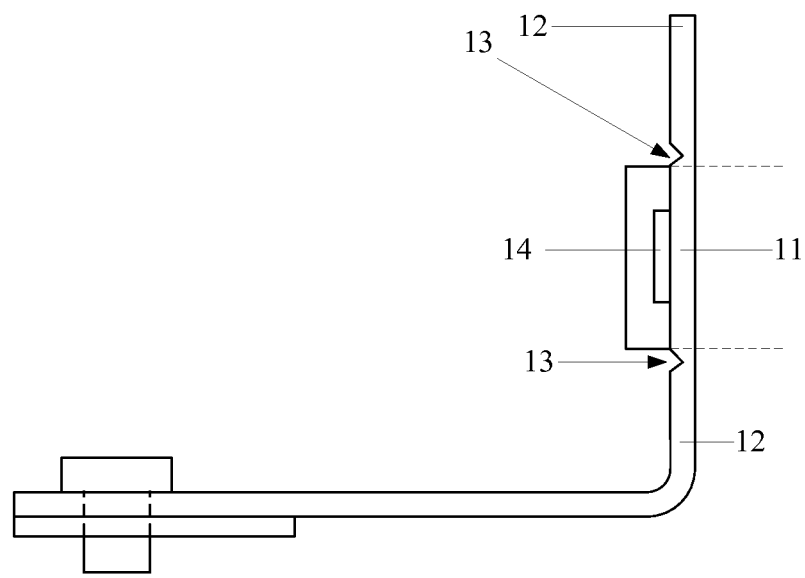
FIG. 2 is a partial schematic diagram of a backlight module using the printed circuit board shown in FIG. 1.
Figure 3:
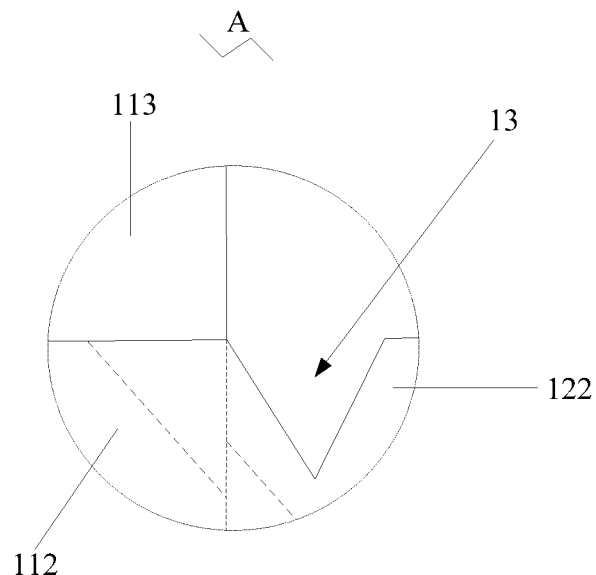
FIG. 3 is an enlarged schematic diagram of portion A of the printed circuit board shown in FIG. 1.

With reference to FIG. 1 to FIG. 3, wherein, FIG. 1 is a schematic diagram a printed circuit board according to an embodiment of the present invention, FIG. 2 is a partial schematic diagram of a backlight module using the printed circuit board shown in FIG. 1, and FIG. 3 is an enlarged schematic diagram of portion A of the printed circuit board shown in FIG. 1.

In this embodiment, the printed circuit board is a metal-based printed circuit board, and two parts of the printed circuit board are disposed vertically and the printed circuit board includes a light bar region 11 and a heat dissipating region 12. The light bar region 11 is located at the middle of the vertical part of the printed circuit board.

As shown in FIG. 2, the light bar region 11 is used for mounting a light bar 14 of the backlight module, and the light bar region 11 forms conductive circuit for supplying power to the light bar 11. In this embodiment, the light bar 14 is a side-light type LED lamp. The mounting of the light bar 14 on the light bar region 11 can refer to the method known by the person skilled in the art, and it will not repeat them here.

The heat dissipating region 12 and the light bar region 11 is connected. The connection location of the heat dissipating 12 and the light bar region 11 provide with a cutting slot 13. And the cutting slot 13 locates at a side of the printed circuit board for mourning the light bar 14 for preventing a short-circuit connection between the heat dissipating 12 and the light bar region 11 through the cutting slot 13.

Specifically, the light bar region 11 includes an aluminum (Al) layer 111 of the light bar region 11, a dielectric layer 112 of the light bar region 11, a conductive layer 113 and the insulating layer 114. The Al layer 111 of the light bar region 11, the dielectric layer 112 of the light bar region 11, the conductive layer 113 and the insulating layer 114 overlap sequentially.

In this embodiment, the conductive layer 113 is a copper plating layer, and the conductive layer 113 forms a conductive circuit. The heat dissipating region 12 includes an Al layer 121 of the heat dissipating region 12 and a dielectric layer 122 of the heat dissipating region 12. The Al layer 121 of the heat dissipating region 12 and the dielectric layer 122 of the heat dissipating region 12 overlap sequentially. Wherein, the Al layer 111 and the Al layer 121 close to the back frame of the backlight module for dissipating heat for the printed circuit board. Because the printed circuit board dissipates heat through the Al layer, the backlight module does not require disposing an aluminum extrusion for heat dissipation in order to effectively reduce the thickness of the side frame of the backlight module.

Among the conductive layer 113, the dielectric layer 122 of the heat dissipating region 12 and the dielectric layer 112 of the light bar region 11, it is provided with the cutting slot 13. In the present embodiment, the cutting slot 13 is a V-shaped slot, in another embodiment of the present invention, the cutting slot 13 can also be other shapes such as a rectangle, and the present invention shall not limit it. The cutting slots 13 can completely cut off the connection between the conductive layer 113 and the remaining Cu of the heat dissipating region 12 after etching. Therefore, it effectively preventing the short-circuit connection between the heat dissipating region 12 and the conductive circuit of the light bar region 11.

The embodiment of the invention disposed with the cutting slot 13 at the light bar region 11 and the heat dissipating region 12 of the printed circuit board. Therefore, it effectively preventing the short-circuit connection between the heat dissipating region 12 and the conductive circuit the of the light bar region 11 through the cutting slot 13 to completely cut off the connection between the heat dissipating region 12 and the conductive layer 113 of the light bar region 11 of the printed circuit board. The embodiment of the invention can avoid the short circuit problem due to uncompleted etching of the conductive layer on the heat dissipating region 12 of the printed circuit board.

The embodiment of the invention further provides a backlight module; the backlight module includes a light bar and a printed circuit board. Wherein the printed circuit board is a metal-based printed circuit board and two parts of the printed circuit board are disposed vertically. The printed circuit boards including a light bar region and a heat dissipating region. The light bar region is located at the middle portion of the vertical part of the printed circuit board.

The light bar region is used for mounting the light bar of the backlight module. The light bar region is formed with the conductive circuit for providing power to the light bar. In this embodiment, the light bar is a side-light type LED lamp. The mounting of the light bar on the light bar region can refer to the method known by the person skilled in the art, and it will not repeat it again.

The light bar region and the heat dissipating region are connected. The connection location of the heat dissipating region and the light bar region provides with a cutting slot, and the cutting slot is located at a side of the printed circuit board for mounting the light bar in order to prevent the short-circuit connection between the heat dissipating region and the conductive circuit the of the light bar region through the cutting slot. In the present embodiment, the cutting slot is a V-shaped slot, and in another embodiment of the present invention, the cutting slot can also be other shapes such as a rectangle, and the present invention shall not limit it. The cutting slot can completely cut off the connection between the conductive layer of the light bar region and the remaining copper of the heat dissipating region after etching. Therefore, it effectively preventing the short-circuit connection between the heat dissipating region and the conductive circuit of the light bar region.

The embodiment of the invention disposed with the cutting slot at the light bar region and the heat dissipating region of the printed circuit board. Therefore, it effectively preventing the short-circuit connection between the heat dissipating region and the conductive circuit of the light bar region through the slot to completely cut off the connection between the heat dissipating region and the conductive layer of the light bar region of the printed circuit board. The embodiment of the invention can avoid the short circuit problem due in uncompleted etching of the conductive layer on the heat dissipating region of the printed circuit board.

The embodiment of the present invention further provides a liquid crystal display device. The liquid crystal display device uses the backlight module described at the above embodiment of the present invention. Because the backlight module has been described in detail in the foregoing, it will not repeat again.

It can be easily understood that the liquid crystal display device of the embodiment of the present invention uses the backlight module described in the above embodiment, and it can avoid the short circuit problem due to uncompleted etching of the conductive layer on the heat dissipating region of the printed circuit board.

Figure 4:
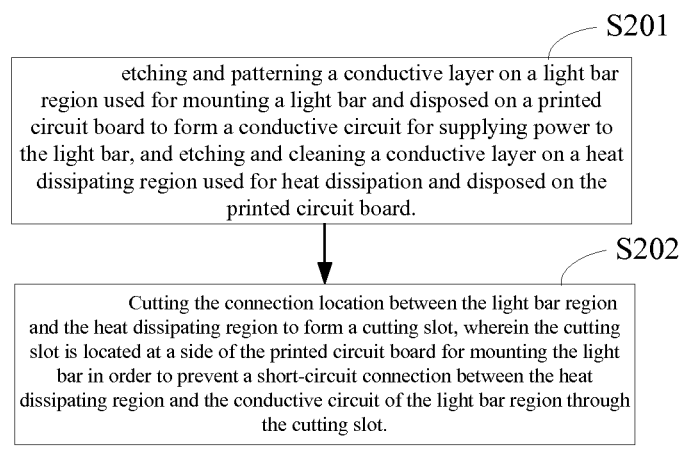
FIG. 4 is a flowchart of manufacturing method for the printed circuit board according to an embodiment of the present invention.

The embodiment of the present invention also provides a manufacturing method for a printed circuit board of a backlight module. As shown in FIG. 4, it is a flowchart of the manufacturing method for the printed circuit board according to an embodiment of the present invention. The manufacturing method includes the following steps.

Step S201: etching and patterning a conductive layer on a light bar region used for mounting a light bar and disposed on a printed circuit board to form a conductive circuit for supplying power to the light bar, and etching and cleaning a conductive layer on a heat dissipating region used for heat dissipation and disposed on the printed circuit board.

Wherein the printed circuit board is a metal-based printed circuit board and two parts of the printed circuit board is disposed vertically. The light bar region may be disposed at the middle portion of the vertical part of the printed circuit board, or the light bar region may use all the vertical part of the printed circuit board. The present invention will not limit it.

Step S202: Cutting the connection location between the light bar region and the heat dissipating region to form a cutting slot, wherein the cutting slot is located at a side of the printed circuit board for mounting the light bar in order to prevent a short-circuit connection between the heat dissipating region and the conductive circuit of the light bar region through the culling slot.

Wherein, the connection location of the light bar region and the heat dissipating region can do a V-shaped cutting (V-Cut) to form a V-shaped slot, that is, using V-Cut process for cutting. Of course, it can also use other process for cutting in other embodiments to get the cutting slots having other shapes. It only has to ensure cutting off the short-circuit connection between the heat dissipating region and the conductive circuit of the light bar region, and the present invention will not limit it. The cutting slots can completely cut off the connection between the conductive layer and the remaining copper of the heat dissipating region after etching. Therefore, it effectively preventing the short-circuit connection between the heat dissipating region and the conductive circuit of the light bar region.

The manufacturing method of the present invention can prevent the short-circuit connection between the heat dissipating region and the conductive circuit of the light bar region through cutting the connection location between the heat dissipating region and the light bar region after etching and cleaning to form the cutting slot and through the cutting slot for completely cutting off the connection between the heat dissipating region and the conductive layer of the light bar region of the printed circuit board. The embodiment of the invention can avoid the short circuit problem due to uncompleted etching of the conductive layer on the heat dissipating region 12 of the printed circuit board.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A backlight module, wherein, the backlight module comprises a light bar and a printed circuit board, and the printed circuit board comprising:
    a light bar region used for mounting the light bar of the backlight module, being formed with a conductive circuit for supplying power for the light bar, comprising an aluminum (Al) layer of the light bar region, a dielectric layer of the light bar region, a conductive layer and an insulating layer, wherein the Al layer of the light bar region, the dielectric layer of the light bar region, the conductive layer and the insulating layer overlap sequentially; and
    a heat dissipating region connected with the light bar region, comprising an Al layer of the heat dissipating region and a dielectric layer of the heat dissipating region wherein the Al layer of the heat dissipating region and the dielectric layer of the heat dissipating region overlap sequentially;
    wherein, a connection location of the light bar region and the heat dissipating region disposes with a cutting slot and the cutting slot locates at a side of the printed circuit board for mounting the light bar in order to prevent a short-circuit connection between the heat dissipating region and the conductive circuit of the light bar region through the cutting slot.

2. The backlight module according to claim 1, wherein, the cutting slot is a V-shaped slot.

3. The backlight module according to claim 1, wherein, the printed circuit board is a metal-based printed circuit board.

4. The backlight module according to claim 2, wherein, the light bar is a side-light type LED lamp.

* * * * *